US007995144B2

(12) United States Patent
Clynes et al.

(10) Patent No.: US 7,995,144 B2
(45) Date of Patent: Aug. 9, 2011

(54) OPTIMIZED PHASE ALIGNMENT IN ANALOG-TO-DIGITAL CONVERSION OF VIDEO SIGNALS

(75) Inventors: Steven D. Clynes, Allen, TX (US); Liming Xiu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1165 days.

(21) Appl. No.: 11/674,029

(22) Filed: Feb. 12, 2007

(65) Prior Publication Data

US 2007/0200840 A1 Aug. 30, 2007

Related U.S. Application Data

(60) Provisional application No. 60/773,583, filed on Feb. 15, 2006.

(51) Int. Cl.

| | |
|---|---|
| ***H04N 3/27*** | (2006.01) |
| ***H04N 9/475*** | (2006.01) |
| ***H03M 1/12*** | (2006.01) |
| ***H03L 7/00*** | (2006.01) |

(52) U.S. Cl. ........ 348/554; 348/572; 348/537; 348/520; 341/155; 341/172

(58) Field of Classification Search .................. 348/572, 348/537, 520; 341/155, 172
See application file for complete search history.

(56) References Cited

U.S. PATENT DOCUMENTS 4,291,330 A * 9/1981 Hirai ............................ 386/273
5,847,701 A * 12/1998 Eglit ............................ 345/204
6,483,447 B1 11/2002 Eglid
7,034,721 B2 4/2006 Lee

OTHER PUBLICATIONS

Pao-Lung Chen, Chin-Che Chung, Chen-Yi Lee, An All-digital PLL with Cascaded Dynamic phase average loop for wide multiplication range applications, Circuits and systems, 2005 ISCAS 2005 IEEE International Symposium on Circuits and Systems (ISCAS) (IEEE Cat. No. 05CH37618), Jul. 25, 2005, pp. 4875.*
Floyd M. Gardner, Properties of frequency difference detectors, IEEE Transactions on Communications vol. Comm-33, No. 2, Feb. 1985. p. 131, and conclusions p. 138.*
Xiu et al., "A Method of Automatically Searching the Sampling Frequency and Sampling Phase for Graphic Digitizer in Pixelated Display Applications", Journal of Imaging Science and Technology, vol. 50, No. 1 (Soc. for Imaging Science and Technology, Jan./Feb. 2006), pp. 80-92.

* cited by examiner

*Primary Examiner* — Jefferey Harold
*Assistant Examiner* — Chandraika Sugrim
(74) *Attorney, Agent, or Firm* — John J. Patti; Wade J. Brady, III; Frederick J. Telecky, Jr

(57) ABSTRACT

A digital video system (2) is disclosed, in which an analog input video signal is sampled at an optimum sample phase ($P_{nc}$), and converted to a digital datastream for display. A phase-locked loop (12) generates a plurality of sample clock phases. One of the sample clock phases ($P_{nc}$) is applied to an analog-to-digital converter (10), which digitizes the analog input video signal accordingly. Phase alignment circuitry (20) is provided that includes three sample-and-hold circuits (22*b*, 22*c*, 22*a*) that sample the analog input video signal, in parallel with the analog-to-digital converter (10), at times before, at, and after the current sample clock phase used by the analog-to-digital converter (10). The earlier and later sampled voltages are compared against the current sampled voltages to generate difference voltages that are each compared against a threshold voltage ($V_{thr}$). The numbers of times that the difference voltages exceed the threshold voltage over a field or frame is analyzed according to various techniques, to determine whether and in which direction to adjust the position of the current sample clock phase within the pixel period.

25 Claims, 8 Drawing Sheets

FIG. 1
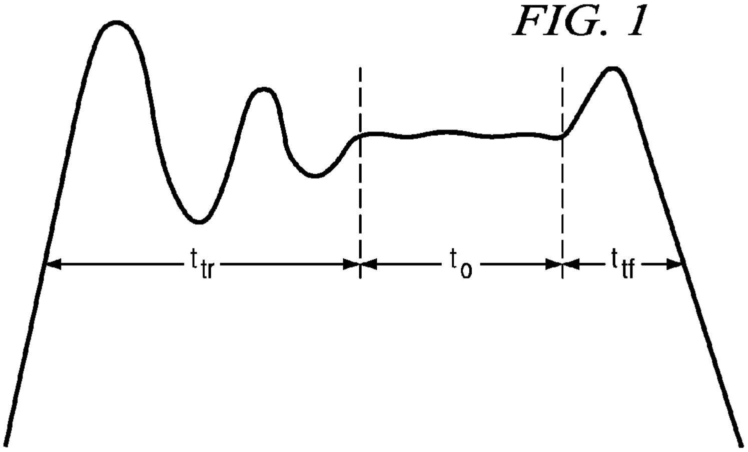
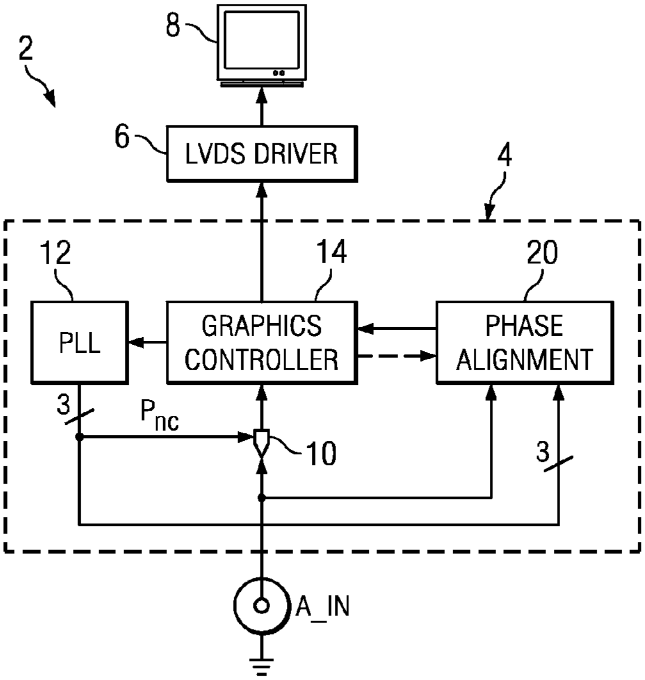
FIG. 2
FIG. 4
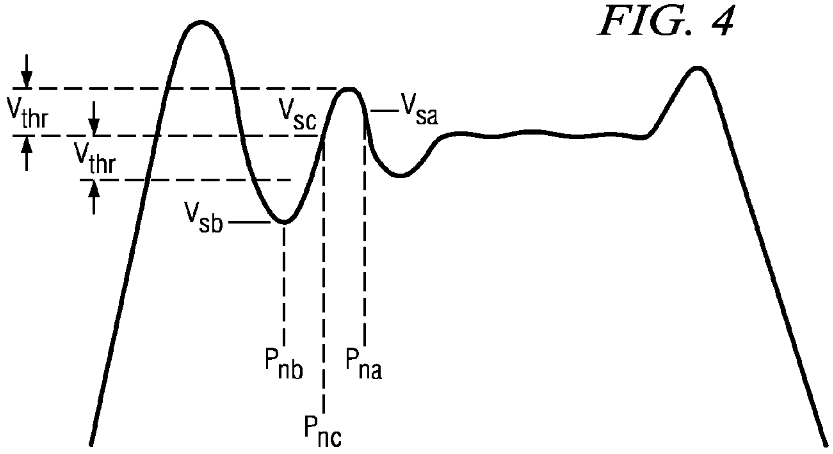

OPTIMIZED PHASE ALIGNMENT IN ANALOG-TO-DIGITAL CONVERSION OF VIDEO SIGNALS

CROSS-REFERENCE TO RELATED APPLICATIONS

This application claims priority, under 35 U.S.C. §119(e), of Provisional Application No. 60/773,583, filed Feb. 15, 2006, which is incorporated herein by this reference.

STATEMENT REGARDING FEDERALLY SPONSORED RESEARCH OR DEVELOPMENT

Not applicable.

BACKGROUND OF THE INVENTION

This invention is in the field of video display systems, and is more specifically directed to the sampling of analog input video signals for display on a digital video display.

As is well-known in the industry, many video display systems now operate in the digital domain, with the brightness and color of each picture element (pixel) in the displayed image controlled according to a digital value. As is also known in the industry and in the art, analog video signals are still prevalent to a large degree, especially as used in the communication and display of television content. In addition, many personal computers still present their video output in analog form. While digital video interfaces (DVI) are known, the additional cost associated with DVI video, and its relatively recent deployment, has resulted in analog video still being widely used, even in new systems.

The digital display of images communicated by analog video signals thus requires the conversion of the image data from the analog domain to the digital domain. And, of course, this analog-to-digital conversion requires the sampling of the analog signal to derive the digital representation. Accurate and faithful digitization of the analog video signal requires accurate and faithful sampling of that analog signal. In an ideal situation, this sampling is straightforward, considering that conventional analog video signals are represented by a sequence of voltage levels (e.g., associated with the luminance and chrominance components), each associated with a pixel on the display and having a duration of a period of the pixel rate (i.e., the pixel period), and each voltage level being relatively constant over the pixel period. Ideally, sampling of the analog video signal at the pixel rate will result in accurate digitization of the analog signal, at the source pixel rate.

However, the analog video signal waveform for each pixel is seldom ideal. FIG. 1 illustrates an example of an analog video signal for given pixel, in which transitions to the analog level are made both prior to and after that pixel, from and to different analog voltage levels. A signal such as that shown in FIG. 1 will be repeated for each pixel in the display field or display frame, with the level of each pixel corresponding to its brightness or color value. As shown in FIG. 1, the leading edge of the signal for this pixel has substantial ringing during its settling time shown as $t_{tr}$. After this settling time, the signal remains relative stable (during time $t_o$). But near the end of the pixel period, the trailing edge of this pixel signal also exhibits ringing during time $t_{tf}$. It is therefore apparent that it will be more accurate to sample this pixel signal during time $t_o$, rather than during times $t_{tr}$ and $t_{tf}$. Not only will the sampled value tend to be incorrect if acquired during one of times $t_{tr}$ and $t_{tf}$, but because the ringing may vary in amplitude, duration, and phase from pixel to pixel, the sampled values for the same pixel will vary from field to field and frame to frame, even if the color or brightness value of the pixel remains constant. The resulting displayed image will be of poor fidelity if samples are routinely acquired in these unstable times $t_{tr}$ and $t_{tf}$.

Of course, reducing the amplitude and duration of the ringing at transitions of the signal will increase the fraction of the pixel period during which accurate samples may be taken, and will also reduce the error resulting from sample points set or drifting within the transition and settling portions of the pixel period. However, the pixel rate required for the communication of display image fields or frames at the resolution of modern high resolution displays requires extremely fast switching times in the analog video signal for a given frame rate. These fast switching times not only reduce the pixel period within which the sampling must reliably take place, but also increase the amplitude of ringing. As such, it is much more difficult to accurately sample and digitize analog video signals for higher resolution displays.

Even at such high pixel rates, it is often possible to detect a stable portion of each pixel period in which accurate samples can be acquired. However, modern display systems are called upon to display images at various resolutions and frame rates, either as may be determined by a specific application, or as may be selected by the system user. Modern displays must therefore be able to sample at various pixel frequencies, and at various points within each pixel period, in order to handle this wide range of resolutions and frame rates.

Phase optimization techniques for determining a good sample point within each pixel period are known in the art. One common approach varies the sampling point within the pixel period from frame-to-frame, and compares the pixel values for successive frames to identify the optimum one of the various sample points. This approach necessarily involves degrading of the image as displayed, because the optimum sample point cannot be discerned without a degraded image against which to compare the optimum sample point. This degrading of the displayed image discourages adjustment of the sample phase during actual operation. In addition, this approach is excessively memory-intensive, because the pixel results from each of the sampled pixels must be stored for comparison with the next frame. Considering that many modern displays are 1600 by 1200 pixels in size, the memory requirements for a single sample phase can exceed two million bytes or words. While the memory requirements for this approach can be reduced by reducing the number of sample phases attempted, this reduction in possible sample phases will also limit and slow the optimization.

Another approach involves sampling the pixel values at various sample phases within a single frame. In this way, the accuracy of the sample for each pixel can be determined, using the pixel value for that pixel and that frame as a reference. However, this approach requires the sample rate to be a large multiple of the pixel rate, in order to accurately sample the same pixel level multiple times within each pixel period. For example, if thirty-two possible sample phases are to be attempted for a 1600 by 1200 display with a refresh rate of 60 Hz, the sample rate would be on the order of 4.4 GHz, which is of course a prohibitively high sample rate for modern technology.

BRIEF SUMMARY OF THE INVENTION

It is therefore an object of this invention to provide circuitry and a method for optimizing the sample phase in the analog-to-digital conversion of video signals.

It is a further object of this invention to provide such circuitry and such a method in which both the memory requirements and the sample rate can be maintained at modest levels.

It is a further object of this invention to provide such circuitry and such a method in which the data path of the actual video signal is not disturbed by the sample phase optimization circuitry and method.

It is a further object of this invention to provide such circuitry and such a method that can also measure drift in sample frequency over a frame of video data.

It is a further object of this invention to provide such circuitry and such a method in which the optimization can be performed over a selected region of the display in which sufficient data activity is detected, to improve the efficiency of the sample phase optimization process.

It is a further object of this invention to provide such circuitry and such a method that optimizes the sample phase within a pixel period in a display system that can display images over a wide range of resolutions, pixel rates, and refresh rates.

It is a further object of this invention to provide such circuitry and such a method that does not disturb the data path or the displayed image from the actual video signal in performing its measurement and optimization.

Other objects and advantages of this invention will be apparent to those of ordinary skill in the art having reference to the following specification together with its drawings.

The present invention may be implemented into circuitry and a method of operating the same in connection with an analog-to-digital conversion function. The input analog video signal is sampled by an analog-to-digital converter at a selected sample phase, and the sampled signal forwarded along a data path to the display. In parallel with the analog-to-digital converter, samples of the input analog video signal are obtained at the current sample phase, at a sample phase in advance of the current sample phase, and at a sample phase lagging the current sample phase. Each of these before, current, and after samples for each pixel in the frame or selected portion of the frame, is acquired at the pixel rate. The pixel level sampled at the current sample phase is compared with that sampled at the earlier sample phase, and the pixel level of the current sample phase is compared with that sampled at the later sample phase. A counter is associated with each comparison, and counts the number of times that each difference exceeds a programmable threshold level. Comparison of the contents of the two counters indicates the direction in which the sample phase can be moved to improve sampling fidelity.

According to another object of the invention, the sampling and comparison functions can be obtained in a vertical window of the displayed frame, and the counts compared as the horizontal position of the window is shifted from frame-to-frame. Deviation in the counts can indicate an error in the sample frequency relative to the pixel frequency.

BRIEF DESCRIPTION OF THE SEVERAL VIEWS OF THE DRAWING

FIG. 1 is a timing diagram of an example of an analog video signal waveform for a pixel.

FIG. 2 is an electrical diagram, in block form, of a display system constructed according to the preferred embodiments of the invention.

FIG. 4 is a timing diagram of an example of an analog video signal waveform for a pixel, illustrating the operation of the preferred embodiments of the invention.

DETAILED DESCRIPTION OF THE INVENTION

Figure 3:
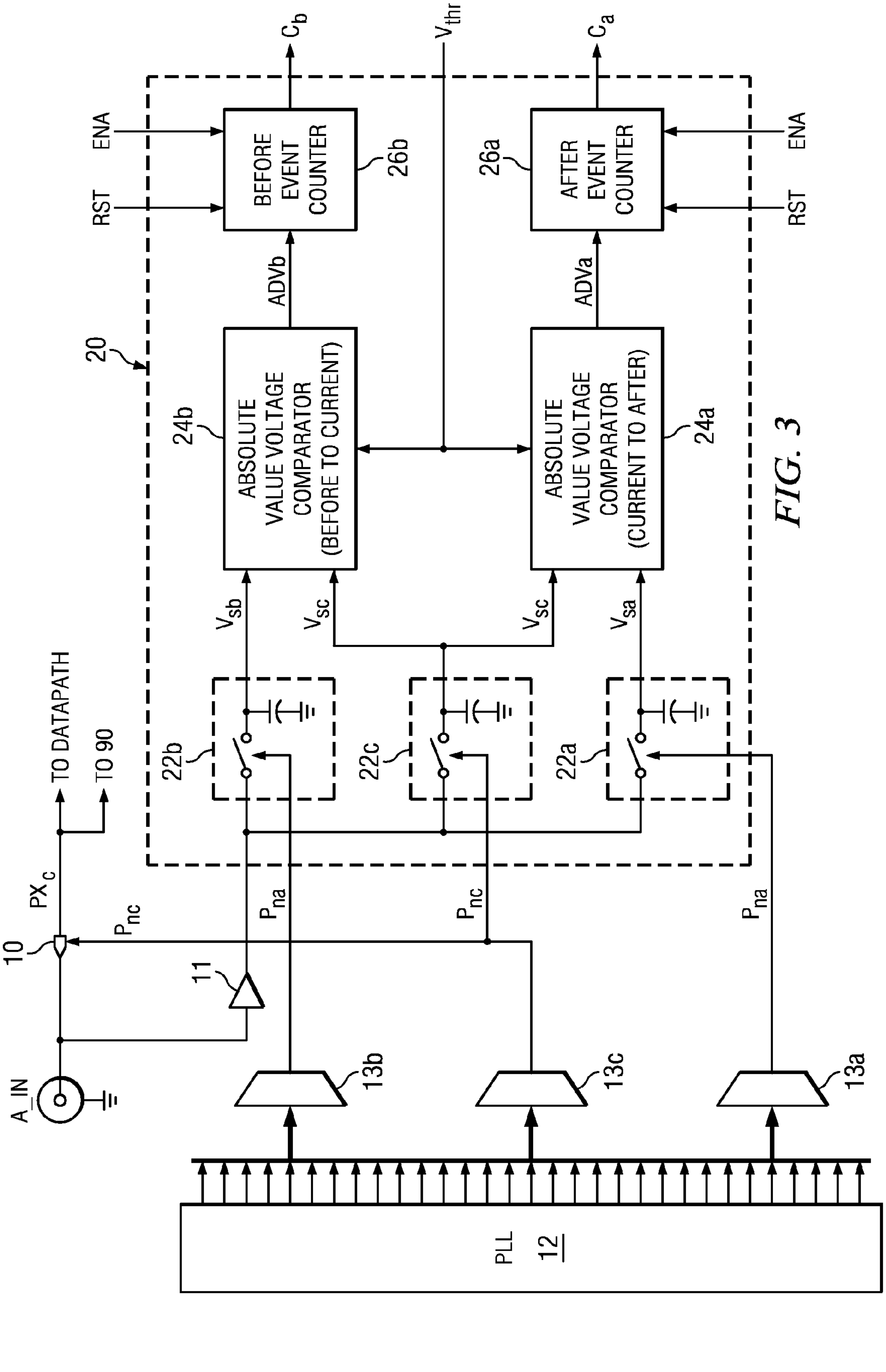
FIG. 3 is an electrical diagram, in block form, of circuitry for optimizing the sample phase of the analog input video signal, constructed according to the preferred embodiments of the invention.

The present invention will be described in connection with its preferred embodiment, namely as implemented into a digital video display system, because it is contemplated that this invention will be particularly beneficial when utilized in such a system. However, it is contemplated that this invention will also be applicable to other applications and systems, in which its inventive features will be beneficial. Accordingly, it is to be understood that the following description is provided by way of example only, and is not intended to limit the true scope of this invention as claimed.

FIG. 2 illustrates digital video display system 2, constructed according to the preferred embodiments of this invention. As shown in FIG. 2, system 2 has input A_IN, which is a coaxial or RCA jack or the like, at which an analog video signal is provided to the display system. It is contemplated that this invention will be especially beneficial when applied to computer graphics implementations, in which at least hundreds of display formats (i.e., combinations of resolution, image size, refresh rate, etc.) are available. Indeed, as known in the art, modern computer operating systems, allow software applications and the user to specify a custom display format, opening up limitless options in the eventual display format. In addition, in the context of television and game systems, analog video inputs may be provided as a composite signal to a single input A_IN, or in the form of multiple "component" signals (e.g., RGB components, YPbPr components, or S-Video components) that are provided to corresponding multiple inputs. In any event, while the preferred embodiments of the invention will be described for the case of a single signal input A_IN, it is contemplated that those skilled in the art having reference to this specification can readily apply this description to a component or other multiple input display system.

The received analog input video signal at input A_IN is received by analog-to-digital converter (ADC) 10. ADC 10 samples the analog input video signal synchronously with sample phase $P_{nc}$ generated by phase-locked loop (PLL) 12, and converts the sampled analog signal to a datastream of digital values $PX_c$, in the conventional manner. The digital datastream produced by ADC 10 is forwarded along the datapath to an input of graphics controller 14, which processes the digital data representative of the analog input signal in the conventional manner, formatting this digital data as appropriate for the video display 8 on which the images are to be displayed. Graphics controller 14 may be realized by a conventional graphics controller integrated circuit, for example the OMAP33x and DaVinci TMS320DM64x digital-signal-processor-based graphics controllers available from Texas Instruments Incorporated. As will be explained in further detail below, it is preferable that graphics controller 14 also includes the necessary and appropriate control logic for controlling the sample phase selection and adjustment processes according to the preferred embodiment of the invention; alternatively, a separate controller may be provided to control these functions. The output of graphics controller 14 is coupled to LVDS (Low Voltage Differential Signaling) video driver circuitry 6, which drives video display 8 with signals corresponding to the image to be displayed, along with the appropriate timing and control signals.

As mentioned above, PLL 12 in system 2 provides timing signals that are used in the video processing of system 2, such timing signals including sample phase $P_{nc}$ according to which the analog input video signal is sampled and digitized. According to the preferred embodiments of the invention, PLL 12 is an analog or digital PLL that generates multiple output phases within each cycle of its locked-on frequency. In the example of FIG. 2, PLL 12 generates thirty-two separate output phases per cycle; of course, more or fewer phases may be produced as desired. Sample phase $P_{nc}$ corresponds to a selected one of these output phases, and is forwarded to ADC 10 as mentioned above. According to the preferred embodiments of the invention, three of the output phases from PLL 12 (including sample phase $P_{nc}$) are forwarded to phase alignment circuitry 20, for use in the selection and adjustment of sample phase $P_{nc}$ from the thirty-two possible output phases, as will be described in further detail below.

As suggested in FIG. 2, several of the functions of system 2 may be integrated into a single integrated circuit device. For example, ADC 10, PLL 12, graphics controller 14, and phase alignment circuitry 20 may be implemented into single integrated circuit device 4. LVDS driver 6 may alternatively also be implemented into device 4, if the technologies sufficiently match one another. Further in the alternative, all or some of the functions of ADC 10, PLL 12, graphics controller 14, and phase alignment circuitry 20 may be realized by individual integrated circuits, or may be combined, in some other combination, into one or more integrated circuits. It is contemplated that the particular manner in which these functions ADC 10, PLL 12, graphics controller 14, phase alignment circuitry 20, and LVDS driver 6 are realized in one or more integrated circuits is left to the system designer, based on the particular system and circuit design constraints.

According to the preferred embodiments of the invention, phase alignment circuitry 20 performs various measurements and determinations regarding the timing of sample phase $P_{nc}$, as will be described in detail below. As evident from FIG. 2, phase alignment circuitry 20 is in parallel with ADC 10, and therefore is not within the data path between input A_IN and video display 8. According to this invention, all of the measurements carried out by phase alignment circuitry 20 thus do not disturb or affect the quality of the image displayed. Furthermore, as will be evident from the following description, the measurements and determinations carried out by phase alignment circuitry 20 do not require that sample phase $P_{nc}$ be moved to a location at which the image degrades, as is required in conventional phase adjustment procedures discussed above. According to this invention, therefore, the presence and operation of phase alignment circuitry 20 has little, if any, impact on the quality of the displayed image.

At the relatively high level shown in FIG. 2, phase alignment circuitry 20 receives multiple output phases from PLL 12. In this example, phase alignment circuitry 20 receives the current sample phase $P_{nc}$, as well as one output phase in advance of (earlier than) sample phase $P_{nc}$, and one output phase lagging (later than) sample phase $P_{nc}$. The results of the measurements made by phase alignment circuitry 20 are forwarded to graphics controller 14, which controls the frequency and phase selection within PLL 12 accordingly. In addition, graphics controller 14 may issue various control signals to control the operation of phase alignment circuitry 20 itself, as will be described in detail below.

As mentioned above, the functions that control PLL 12 in response to phase alignment circuitry 20, and also that control phase alignment circuitry 20 itself, may conveniently be carried out by graphics controller 14, given the large computational capacity provided by modern graphics controller devices and functions. Alternatively, a separate control circuit or programmable logic function may be provided to control PLL 12 and phase alignment circuitry 20, if desired.

FIG. 3 illustrates the construction of phase alignment circuitry 20 and its operative relationship with ADC 10 and PLL 12, according to the preferred embodiments of the invention. PLL 12 generates multiple (e.g., thirty-two) sample phases, all of which are presented to inputs of multiplexers **13*b*, 13*c*, 13*a*. Multiplexer 13*c* selects the desired current sample phase $P_{nc}$, which is forwarded to ADC 10 to control the sampling of the analog input video signal. The selection of the desired sample phase $P_{nc}$ by multiplexer 13*c* is controlled by graphics controller 14, or by other control circuitry in system 2 as described above relative to FIG. 2. Graphics controller 14 also controls multiplexer 13*b* to select one of the output phases from PLL 12 as "before" phase $P_{nb}$, namely an output phase that is earlier in time than current sample phase $P_{nc}$, and controls multiplexer 13*a* to select one of the output phases from PLL 12 as "after" phase $P_{na}$, namely an output phase that is later in time than current sample phase $P_{nc}$. As shown in FIG. 3, analog input video signal is received at input A_IN, and is sampled by ADC 10 at current sample phase $P_{nc}$, and converted by ADC 10** into digital signal $PX_c$ for each pixel.

The analog input video signal from input A_IN is also forwarded, via buffer 11, to phase alignment circuitry 20. Buffer 11 blocks reflections of any signal modulation by phase alignment circuitry 20 from degrading the actual analog input video signal at the input of ADC 10. Within phase alignment circuitry 20, the output of buffer 11 presents the buffered analog input video signal to three sample-and-hold circuits **22*b*, 22*c*, 22*a*, which are constructed in the conventional manner, for example as shown in FIG. 3. Sample-and-hold circuit 22*b* samples and stores the voltage of the buffered analog input video signal at times corresponding to "before" phase $P_{nb}$. Similarly, sample-and-hold circuit 22*c* samples and stores the voltage of the buffered analog input video signal at sample times corresponding to sample phase $P_{nc}$, and sample-and-hold circuit 22*a* samples and stores the voltage of the buffered analog input video signal at times corresponding to "after" phase $P_{na}$. As a result, sample-and-hold circuits 22***b*, 22*c*, 22*a* obtain three separate samples $V_{sb}$, $V_{sc}$, and $V_{sa}$, respectively, of the analog input video signal, at separate points in time within each cycle of PLL 12.

Phase alignment circuitry 20 includes two comparators 24*b*, 24*a*, each for comparing the absolute value of a voltage difference to a selected threshold voltage. In this embodiment of the invention, comparator 24*b* receives the sampled voltages $V_{sb}$, $V_{sc}$ from sample-and-hold circuits 22*b*, 22*c*, respectively, and compares the absolute value of the difference between these voltages to a threshold voltage $V_{thr}$. As will be described in further detail below, threshold voltage $V_{thr}$ is controllable by graphics controller 14 or other control logic to be set at a desired level, and is preferably adjustable to further characterize the position of the current sample phase $P_{nc}$. Comparator 24*b* issues an output signal on line ADVb to event counter 26*b* based upon this comparison. Event counter 26*b* is a conventional digital counter (e.g., a twenty-two bit counter), which is advanced with each active pulse or level its input receives on line ADVb, and which has an output C*b* that presents the contents of counter 26*b*. In this embodiment of the invention, counter 26*b* has a reset input RST and an enable input ENA. An active signal at reset input RST clears the contents of counter 26*b*, and an active level at enable input ENA enables counter 26*b* to respond to active signals at input ADVb.

Similarly, comparator 24*a* receives the sampled voltages $V_{sa}$, $V_{sc}$ from sample-and-hold circuits 24*a*, 24*c*, respectively, and compares the absolute value of the difference between these voltages against threshold voltage $V_{thr}$. In response to the absolute value of this difference voltage exceeding threshold voltage $V_{thr}$, comparator 24*a* issues an active signal on line ADVa to an input of counter 26*a*, which advances its contents accordingly. Counter 26*a* is preferably constructed identically as counter 26*b* described above, including reset input RST and enable input ENA, to which counter 26*b* is responsive. Counter 26*a* has output $C_a$ at which it presents its current contents.

In operation, phase alignment circuitry 20 acquires three voltage samples for each cycle of the output clock of PLL 12. As will be described below, the frequency of the output clock of PLL 12 at least approximates the pixel rate of the analog input video signal. These three voltage samples include sample voltage $V_{sc}$, which is taken by sample-and-hold circuit 22*c* at the current sample phase $P_{nc}$, and which thus matches the sample value acquired by ADC 10 in the data path of system 2. In addition, sample voltage $V_{sb}$ is acquired by sample-and-hold circuit 22*a* at a sample phase $P_{nb}$ that is earlier in time than current sample phase $P_{nc}$, and sample voltage $V_{sa}$ is acquired at a sample phase $P_{na}$ that is later in time than current sample phase $P_{nc}$. The relative timing of these sample phases is illustrated by way of the example shown in FIG. 4.

Absolute value voltage comparator 24*b*, as described above, compares the absolute value of the difference voltage between "before" sampled voltage $V_{sb}$ and "current" sampled voltage $V_{sc}$ to threshold voltage $V_{thr}$, and issues a signal at output ADVb accordingly. In other words, comparator 24*b* performs the logical equation:

$$ADVb=|V_{sb}-V_{sc}|>V_{thr}$$

in that output ADVb is active (i.e., TRUE) if the absolute value of the difference voltage exceeds threshold voltage $V_{thr}$. In the example pixel shown in FIG. 4, the difference between sample voltages $V_{sb}$ and $V_{sc}$ does exceed threshold voltage $V_{thr}$, and in this case counter 24*b* would therefore advance the count $C_b$ of counter 26*b*. Similarly, absolute value voltage comparator 24*a* compares the absolute value of the difference voltage between "after" sampled voltage $V_{sa}$ and "current" sampled voltage $V_{sc}$, compares this difference voltage to threshold voltage $V_{thr}$, and issues a signal at output ADVb accordingly. Comparator 24*b* thus performs the logical equation:

$$ADVa=|V_{sa}-V_{sc}|>V_{thr}$$

Output ADVa will thus be active (i.e., TRUE) if the absolute value of the difference voltage exceeds threshold voltage $V_{thr}$. In the example pixel shown in FIG. 4, the difference between sample voltages $V_{sa}$ and $V_{sc}$ does not exceed threshold voltage $V_{thr}$, and counter 24*a* would not advance its count $C_a$ for this pixel.

Figure 5:
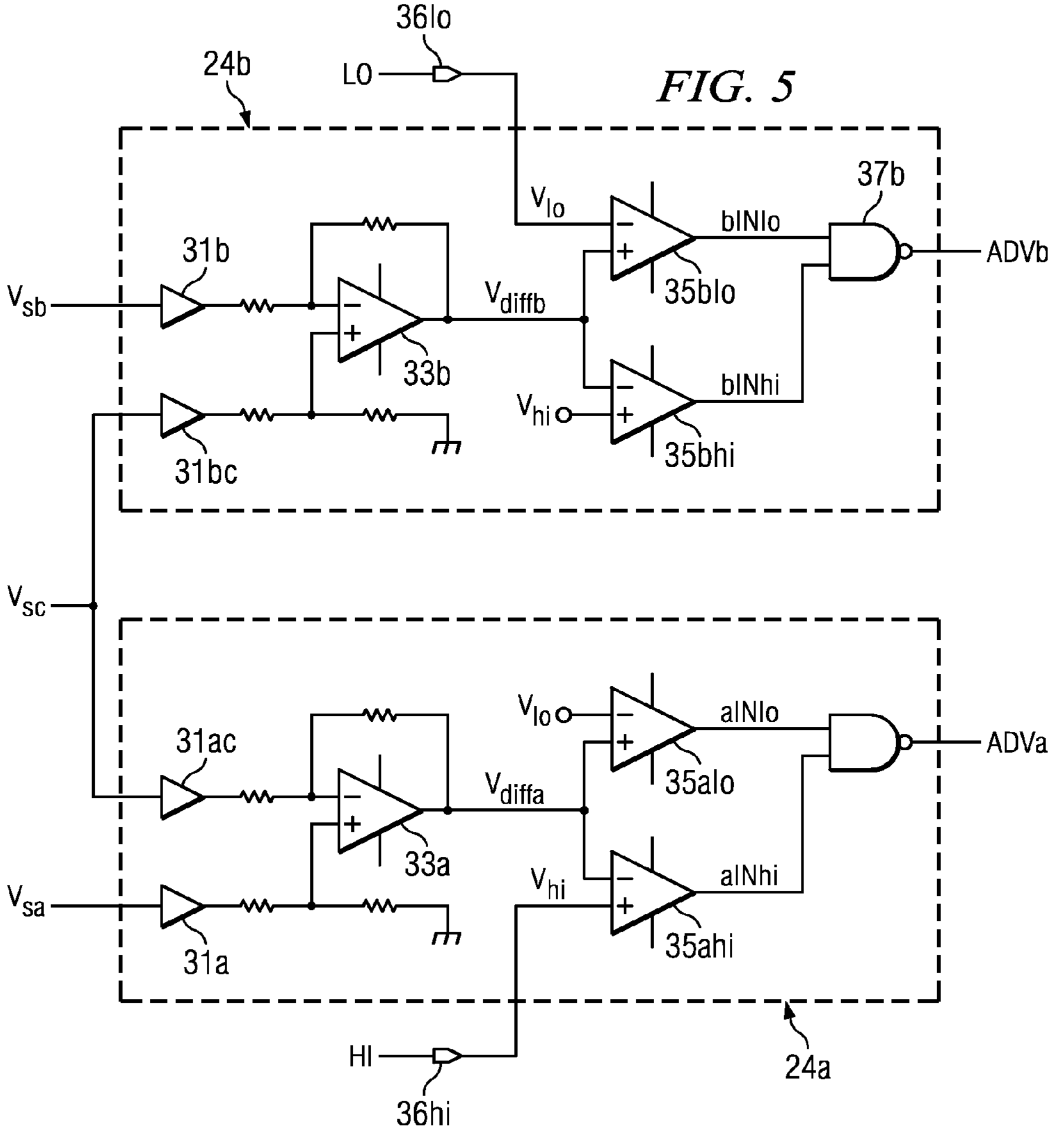
FIG. 5 is an electrical diagram, in schematic and block form, illustrating the construction of comparison circuitry in the optimizing circuitry of FIG. 3, according to the preferred embodiments of the invention.

FIG. 5 illustrates the construction of comparators 24*b*, 24*a* for performing these comparisons, according to the preferred embodiments of the invention. As shown in FIG. 5, comparator 24*b* includes buffers 31*b*, 31*bc* that receive, at their respective inputs. sample voltages $V_{sb}$, $V_{sc}$. Differential amplifier 33*b* receives the output of buffer 31*bc* at its positive input, and the output of buffer 31*b* at its negative input; differential amplifier 33*b* is biased and its feedback paths arranged in the conventional manner to produce, at its output, a differential voltage $V_{diffb}$ corresponding to the difference voltage between sampled voltage $V_{sc}$ and sampled voltage $V_{sb}$. Differential voltage $V_{diffb}$ is applied to the positive input of comparator 35*blo*, which receives a reference voltage $V_{lo}$ from DAC 36*lo* at its negative input, and to the negative input of comparator 35*bhi*, which receives a reference voltage $V_{hi}$ from DAC 36*hi* at its positive input. The output of comparator 35*blo* is coupled to an input of NAND gate 37*b* via line bINlo, and the output of comparator 35*bhi* is coupled to a second input of NAND gate 37*b* via line bINhi. NAND gate 37*b* drives line ADVb at its output.

Comparator 24*a* is similarly constructed as comparator 24*b*. The inputs of buffers 31*ac*, 31*a* receive sample voltages $V_{sc}$, $V_{sa}$, respectively. Differential amplifier 33*a* receives the output of buffer 31*a* at its positive input, and the output of buffer 31*ac* at its negative input, and is biased and its feedback paths arranged in the conventional manner to produce differential voltage $V_{diffa}$ at its output. Differential voltage $V_{diffa}$, which corresponds to the difference voltage between sampled voltage $V_{sc}$ and sampled voltage $V_{sa}$, is applied to the positive input of comparator 35*alo*, which receives reference voltage $V_{lo}$ at its negative input, and to the negative input of comparator 35*ahi*, which receives reference voltage $V_{hi}$ at its positive input. The output of comparator 35*alo* is coupled to an input of NAND gate 37*a* via line aINlo, and the output of comparator 35*ahi* is coupled to a second input of NAND gate 37*a* via line aINhi. NAND gate 37*a* drives line ADVa at its output.

DACs 36*lo*, 36*hi* are conventional digital-to-analog converters that receive digital control words LO, HI at their inputs, respectively, and that generate their respective reference voltages $V_{lo}$, $V_{hi}$ at their outputs. Digital control words LO, HI are preferably generated by graphics controller 14 or other control logic, to set the level of threshold voltage $V_{thr}$. While this construction permits threshold voltage $V_{thr}$ to have a different negative polarity magnitude than its positive polarity magnitude, it is preferred that the voltages $V_{lo}$, $V_{hi}$ are substantially equal in magnitude to one another, so that the threshold voltage $V_{thr}$ will be the same for either polarity difference voltage.

The operation of comparators 24*b*, 24*a* shown in FIG. 5 will now be described with reference to comparator 24*b*, it being understood that comparator 24*a* will operate in an identical manner with respect to its input voltages $V_{sc}$, $V_{sa}$.

The two sample voltages $V_{sc}$, $V_{sb}$, buffered by buffers 31*bc*, 31*b*, respectively, produce differential voltage $V_{diffb}$ at the output of differential amplifier 33*b*. This differential voltage $V_{diffb}$ has a positive polarity if sample voltage $V_{sc}$ exceeds sample voltage $V_{sb}$, and a negative polarity if the reverse is true. As mentioned above, the task of comparator 24*b* is to compare the absolute value of this difference voltage to the threshold voltage $V_{thr}$; this function is accomplished by the two comparators 35*blo*, 35*bhi*. For a positive polarity differential voltage $V_{diffb}$, comparator 35*blo* will always return a high logic level result (i.e., line bINlo will be active high), because any positive level of differential voltage $V_{diffb}$ will force the output of comparator 35*blo* high. However, comparator 35*bhi* will issue a positive level output if differential voltage $V_{diffb}$ is less than reference voltage $V_{hi}$; in this case, NAND gate 37*b* will receive high levels at both of its inputs, and will force its output (line ADVb) low as a result. In this case, the absolute value of differential voltage $V_{diffb}$ is less than the threshold voltage $V_{thr}$ (defined, in the example of FIG. 5, as having a negative polarity of $-V_{lo}$ and a positive polarity of $+V_{hi}$), and counter 26*b* is not advanced. If, however, positive polarity differential voltage $V_{diffb}$ exceeds reference voltage $V_{hi}$, comparator 35*bhi* will issue a low logic level at its output on line bINhi, which will cause NAND gate 37*b* to drive its output, on line ADVb, to a high logic level. This will advance counter 26*b*.

Similarly, if sample voltage $V_{sb}$ exceeds sample voltage $V_{sc}$, differential voltage $V_{diffb}$ will have a negative polarity. Comparator 35*bhi* will unconditionally issue a high logic level on line bINhi, while the state of line bINlo will depend on whether the magnitude of the negative polarity differential voltage $V_{diffb}$ exceeds the magnitude of voltage $V_{lo}$. If not, comparator 35*blo* presents a high logic level on line bINlo, NAND gate 37*b* drives its output low, and counter 26*b* is not advanced. If so, comparator 35*blo* issues a low logic level on line bINlo, NAND gate 37*b* drives its output high on line ADVb, and counter 26*b* advances.

As mentioned above, comparator 24*a* operates in an identical manner, except that it is comparing sample voltage $V_{sc}$ against sample voltage $V_{sa}$.

The sampling and comparison performed by phase alignment circuitry 20 as described generally above is repeated for each pixel in the field or frame of analog input video signal (i.e., each pixel between vertical sync pulses). Alternatively, through use of the enable input ENA, the operation of counters 26*b*, 26*a* may be enabled only for selected windows of the frame or field, as will be described in further detail below. Upon completion of the field or frame (or window thereof), the relative values of the counts $C_b$, $C_a$ provide an indication of whether current sample phase $P_{nc}$ is optimized, as will now be described.

It has been discovered, according to this invention, that because of the nature of the analog input video signal for each pixel, one can draw certain conclusions about the position of the current sample point from the relative values of the counts $C_b$, $C_a$. As evident from the example in FIG. 4, ringing in the signal is present at both the leading edge and the trailing edge of the pixel signal; this is true for positive-going leading edges as shown in FIG. 4, and also for negative-going leading edges. The ringing at the leading edge of the signal dampens over time to a steady-state level, while the ringing at the trailing edge of the signal increases over time from this steady-state level. As such, if a current sample phase $P_{nc}$ is within the ringing interval near the leading edge of the pixel period, the likelihood is greater that earlier sample phase $P_{nb}$ will produce a differential voltage $V_{diffb}$ that exceeds the threshold voltage $V_{thr}$, than the likelihood of later sample phase $P_{na}$ producing a differential voltage $V_{diffa}$ that exceeds threshold voltage $V_{thr}$. This very situation is shown in FIG. 4. While the specific sampled values and comparison results will vary from pixel to pixel, the overall counts $C_b$, $C_a$ taken over a relatively large number of pixels in a given field or frame will tend to indicate whether the current sample point $P_{nc}$ is too near the leading edge or too near the trailing edge.

Similarly, if the current sample phase is within the ringing period near the trailing edge of the pixel period, the likelihood that the later sample phase $P_{na}$ will produce a differential voltage $V_{diffa}$ that exceeds threshold voltage $V_{thr}$ is greater than the likelihood that earlier sample phase $P_{nb}$ will produce a differential voltage $V_{diffb}$ that exceeds the threshold voltage $V_{thr}$. This difference will be reflected over a large number of pixels within a field, frame, or portion thereof.

In addition, relatively equivalent counts $C_b$, $C_a$ resulting from a field or frame will tend to indicate that the current sample phase $P_{nc}$ is in a relatively stable location within the pixel period, between the ringing events at both the leading and trailing edges of the analog input video signal for each pixel, assuming that threshold voltage $V_{thr}$ is set reasonably low (i.e., if threshold voltage $V_{thr}$ is set too high, then only the most extreme ringing events can advance one of the counts $C_b$, $C_a$).

According to the preferred embodiments of the invention, the optimization of the location of current sample phase $P_{nc}$ within the pixel period can be performed by iterating one or more parameters involved in the operation of phase alignment circuitry 20. These parameters of course include the location of current sample phase $P_{nc}$ itself within the pixel period, to determine the optimum location within the pixel location. In addition, the time difference ("phase delta") between current sample phase $P_{nc}$ and the "before" sample phase $P_{nb}$, and between current sample phase $P_{nc}$ and the "after" sample phase $P_{na}$, can be varied in optimizing the position of sample phase $P_{nc}$ in the pixel period. Furthermore, threshold voltage $V_{thr}$ can also be varied between small and large values, in the optimization process. For example, if the counts $C_b$, $C_a$ are approximately equal to one another in a case even for a relatively small threshold voltage $V_{thr}$, one can conclude that the current sample phase $P_{nc}$ is in a relatively stable portion of the pixel period. On the other hand, if the counts $C_b$, $C_a$ are approximately equal to one another but threshold voltage $V_{thr}$ is relatively large, one may conclude that current sample phase $P_{nc}$ is at or near a local extrema, and thus in an unstable and inaccurate location of the pixel period.

Various alternative methods for automatically adjusting and optimizing the position of sample phase $P_{nc}$ will now be described in connection with the preferred embodiments of this invention. It is contemplated that these described embodiments are merely examples, and that those skilled in the art having reference to this specification will readily recognize alternative approaches to, and variations of, these described embodiments, all within the scope of this invention.

Figure 6:
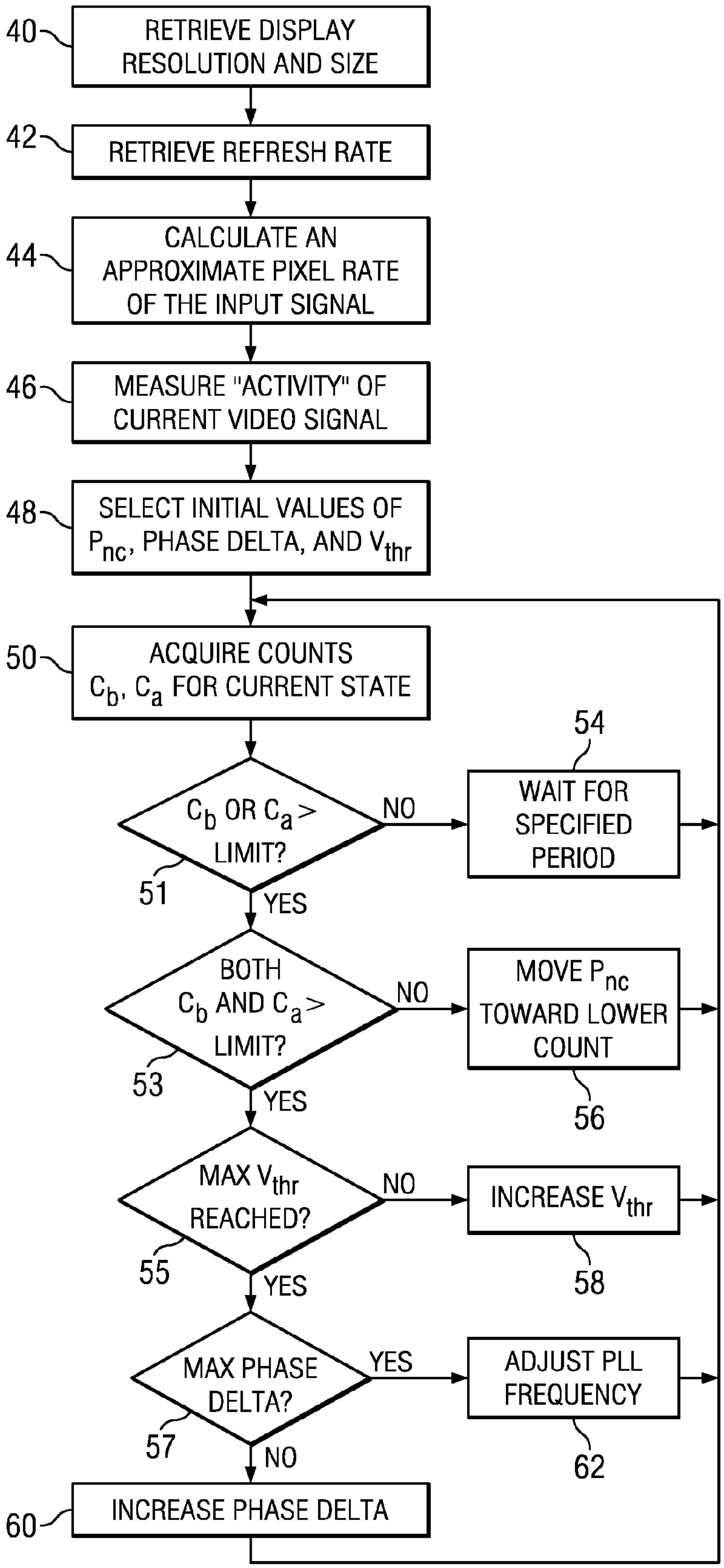
FIG. 6 is a flow diagram illustrating the operation of a method of optimizing the sample phase of an analog input video signal, according to a first preferred embodiment of the invention.

Referring now to FIG. 6, the operation of system 2, including phase alignment circuitry 20, in optimizing the position and alignment of sample phase $P_{nc}$ according to a first preferred embodiment of the invention will now be described. It is contemplated that graphics controller 14 of system 2 will be executing a sequence of program instructions stored in system 2 to carry out the operations described in this specification, according to these examples and preferred embodiments of the invention. Alternatively, as discussed above, other programmable logic or another controller function may be provided within system 2 to carry out these operations. Furthermore, for purposes of this description, when reference is made to graphics controller 14 carrying out and executing these processes, it is to be understood that such other control logic and programmable logic, if present in system 2, may instead perform such functions. In either case, it is contemplated that those skilled in the art having reference to this specification will be readily able to realize and implement such control logic, and to program the corresponding program instructions that are necessary and useful for carrying out these instructions, without undue experimentation.

The operation of system 2 in this example begins with processes 40 and 42, in which graphics controller 14 retrieves certain parameters regarding the analog input video signal. These parameters are those necessary to derive an estimate of the pixel rate, and as such include the desired display resolution and image size. In process 42, graphics controller 14 comprehends the frame rate of the analog input video signal. Based on these parameters, in process 44, graphics controller 14 calculates an approximation of the pixel rate of the analog input video signal received at input A_IN. This pixel rate approximation is used to control the frequency of PLL 12, so that the period of its output phases corresponds closely to the pixel rate of the analog input video signal. As will be described in detail below, it is contemplated that, according to this invention, this pixel rate may not be exactly accurate, and as such phase alignment circuitry 20 includes circuitry for taking measurements upon which adjustment of the pixel rate can be made. At this stage of the process, however, graphics controller 42 can begin with an approximate (or better) determination of the pixel rate in the incoming video signal.

According to the preferred embodiments of the invention, process 46 is an optional process that measures the pixel "activity" of the current video signal. As known in the art, if the image represented by the analog input video signal is substantially a constant color at a constant brightness, there will be little transition from pixel-to-pixel within the signal. There will be little or no ringing in such a signal, because the pixel-to-pixel transitions will be at most minimal. As such, regardless of how poor an estimate is made of the pixel rate, and regardless of the sample phase selection within each pixel period, the resulting sampling of the input analog video signal will provide an accurate representation. It is therefore preferred to ensure that there is some level of "activity" from pixel-to-pixel in the analog input video signal, or at least in a portion of the image frame represented by that signal, to ensure that a poor sample phase selection can be detected and corrected. This "activity" determination is carried out in process 46 by graphics controller 14, in combination with optional circuitry that may be realized within phase alignment circuitry 20, an example of which is illustrated in FIG. 9 and will now be described.

Figure 9:
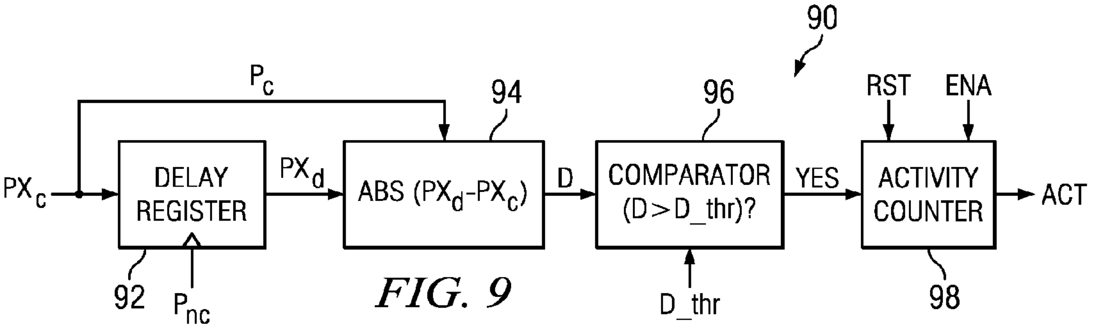
FIG. 9 is an electrical diagram, in block form, of circuitry for measuring the activity of a region of an image to be displayed, as used in connection with the preferred embodiments of the invention.

FIG. 9 illustrates the construction of activity measurement circuitry 90, which as discussed above, may be implemented within and as part of phase alignment circuitry 20; alternatively, of course, activity measurement circuitry 90 may be realized separately from phase alignment circuitry 20 within system 2. As shown in FIG. 9 (with reference to FIG. 2), delay register 92 in activity detection circuitry 90 receives each sampled pixel value on line $PX_c$, each of which is a digital value analog pixel value received at input A_IN. Delay register 92 is clocked by sample phase $P_{nc}$, and as such is a single stage delay register that presents, at its output on line $PX_d$, the sampled pixel value from one pixel location previous to the current pixel value on line $PX_c$. Lines $PX_c$ and $PX_d$ are both forwarded to absolute value function 94, which generates a digital value on its output line D corresponding to the absolute value of the difference value between the current digital pixel value on line $PX_c$ and the digital pixel value from the immediately preceding pixel on line $PX_d$ (i.e., $D=|PX_d-PX_c|$). The value on line D represents an unsigned magnitude of this difference, and is applied to comparator 96, which compares this difference value on line D against a programmable digital threshold value D_thr communicated to comparator 96 from graphics processor 14. Comparator 96 issues an active logic level at its output in response to the value on line D exceeding the threshold level D_thr. This output of comparator 96 is applied to the input of activity counter 98, which advances the count stored as its contents in response to each "yes" result communicated from comparator 96, and which presents its contents on lines ACT to graphics processor 14. Activity counter 98 also receives a reset input on line RST, responsive to which it clears its contents, and an enable input on line ENA, responsive to an active signal on which it advances its counter in response to a "yes" signal at its input (and, in response to an inactive level at this input, counter 98 does not advance its contents regardless of the state of line "yes").

In operation, therefore, activity measurement circuitry 90 is able to measure the pixel-to-pixel activity for a frame or field (or a portion of a frame or field, as controlled by signals on enable line ENA), by counting the number of times a pixel-to-pixel transition exceeds a selected threshold level D_thr as process 46 (FIG. 6) is executed. The resulting decision from process 46, which is made by graphics processor 14 based on the value on lines ACT, indicates whether to enable phase alignment circuitry 20 to begin optimization of sample phase $P_{nc}$. If not, the process of FIG. 6 is stopped at this point, or alternatively the threshold value D_thr is adjusted, or the region of the frame or field at which activity is measured is changed, and process 46 is repeated. If graphics processor 14 determines that sufficient activity is present so that phase optimization can be made, control passes to process 48 of FIG. 6.

Referring back to FIG. 6, the method of operation continues with the selection of initial values of current sample phase $P_{nc}$, the selection of phase delta or difference between "before" sample phase $P_{nb}$ and current sample phase $P_{nc}$ (and between "after" sample phase $P_{na}$ and current sample phase $P_{nc}$), and also the selection of threshold voltage $V_{thr}$, which as described above is the threshold difference voltage that determines an "event" for advancing of the counters. The initial value of sample phase $P_{nc}$ is preferably selected to be near the center of the pixel period; the initial values of the phase delta and of threshold voltage $V_{thr}$ may be derived from characterization.

In process 50, phase alignment circuitry 20 is operated over one or more fields or frames of the video signal (or selected portion of the video signal, based on video activity as described above), for the current values of sample phase $P_{nc}$, phase delta, and threshold difference voltage $V_{thr}$. In this operation of process 50, the counts $C_b$, $C_a$ of the number of ringing events before and after current sample phase $P_{nc}$ are determined over the one or more fields or frames that were measured. Decision 51 determines whether either of counts $C_b$ or $C_a$ exceeds a limit value. This limit value is preferably selected and programmed into graphics controller 14 based on characterization of the video display system, the signal, or on some other basis. If neither of counts $C_b$, $C_a$ exceeds the limit (decision 51 is NO), current sample phase $P_{nc}$ is deemed adequate for accurate sampling of the analog input video signal. In this event, measurement process 50 is preferably repeated after a specified time (process 54), to compensate for any frequency drift or environmental factors that may change the accuracy of the sampling of the analog input signal. Alternatively, as will be discussed below, further optimization can be attained by also iterating and adjusting the phase delta, threshold difference voltage $V_{thr}$ or both.

If at least one of the counts $Cb$, $Ca$ exceeds the limit (decision 51 is YES), decision 53 is executed to determine whether both counts $C_b$, $C_a$ exceeded the limit. An event of only one of counts $C_b$, $C_a$ exceeding the limit (decision 53 is NO) conveys information about the position of current sample phase $P_{nc}$ within the pixel period, as discussed above. If the “before” count $C_b$ exceeds the limit but the “after” count $C_a$ does not, current sample phase $P_{nc}$ is likely to be too close to the leading edge of the pixel period; conversely, if the “after” count $C_a$ exceeds the limit but the “before” count $C_b$ does not, current sample phase $P_{nc}$ is likely to be too close to the trailing edge of the pixel period. In either case, process 56 is executed to move current sample phase $P_{nc}$ in the direction of the lower count value by a selected number of output phases (typically one) of PLL 12. Counters 26*b*, 26*a* are reset or cleared, and control returns to process 50 to repeat the measurement of sample voltage difference events surrounding the new current sample phase $P_{nc}$. At this stage of the operation, because at least one of the counts $C_b$, $C_a$ is below the limit, convergence to a stable and accurate sample phase $P_{nc}$ (decision 51 is NO) is generally achieved.

On the other hand, if both counts $C_b$, $C_a$ exceed the limit (decision 53 is YES), the current sample phase $P_{nc}$ is in a highly unstable location, most likely near either edge of the pixel period. But because both counts exceed the limit, no indication is provided regarding the direction in which current sample phase $P_{nc}$ ought to be moved. Decision 55 is then executed to determine whether difference threshold voltage $V_{thr}$ is at its maximum available value. If not (decision 55 is NO), difference threshold voltage $V_{thr}$ is increased in process 58, counters 26*b*, 26*a* are cleared, and measurement process 50 is repeated to determine whether directional information can be obtained from a coarser threshold determination.

If the maximum difference voltage threshold $V_{thr}$ is already being used (decision 55 is YES), however, then adjustment of this parameter cannot provide additional information. Decision 57 is then executed to determine whether the phase delta (time between the “before” and “after” sample phases $P_{nb}$ and $P_{na}$, respectively, and current sample phase $P_{nc}$) is at its maximum available value. If not (decision 57 is NO), then this parameter can be adjusted to a coarser value to obtain directional information. The phase delta is increased in process 60, counters 26*b* and 26*a* are reset, and control is passed to process 50 for measurement of events using the coarser phase delta value.

Of course, the adjustment of the phase delta and the adjustment of the threshold voltage may be reversed in order, such that decision 57 and process 60 are performed first, after a YES result of decision 53, followed by decision 55 and process 58 if the maximum phase delta is reached.

However, if both the difference voltage threshold $V_{thr}$ and the phase delta parameters are at their maximum values (decision 57 is YES), and the counts $C_b$, $C_a$ are still exceeding their limits, perhaps the current sampling phase $P_{nc}$ cannot be further improved. If the displayed image quality is poor, the user may be motivated to change the resolution, image size, or refresh rate, in which case the process of phase alignment is repeated. Or perhaps the output frequency of PLL 12 does not match the pixel rate of the analog input video signal. To attempt adjustment of the sample frequency, control passes to process 62, in which the frequency of PLL 12 is adjusted based on measurements of counts $C_b$, $C_a$, as will now be described.

Figure 10A:
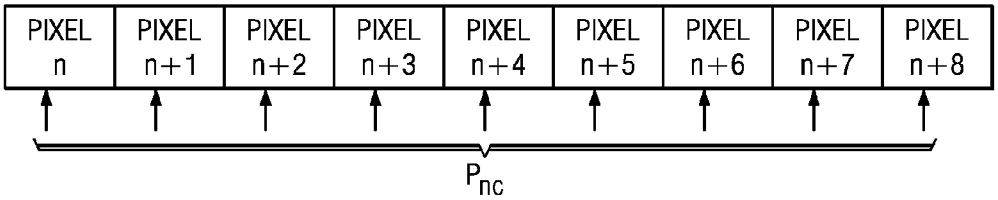
FIGS. 10*a* through 10*c* are timing diagrams illustrating the effects of sample frequency error relative to the pixel rate of an analog input video signal.
Figure 10B:
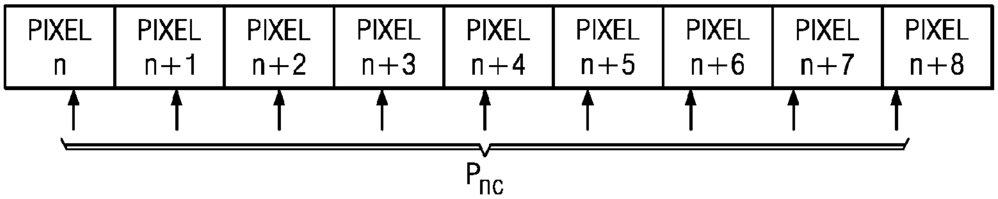
Figure 10C:
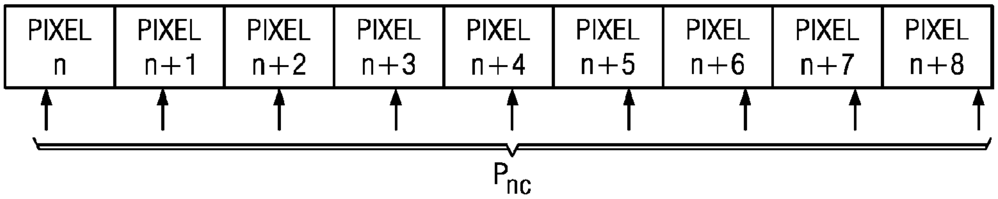

FIGS. 10*a* through 10*c* illustrate the effects of sampling at a frequency that differs from the pixel rate of the input signal. In FIG. 10*a*, a series of pixel periods n through n+8 are shown, each with an arrow indicating the position within the pixel periods of a current sample phase $P_{nc}$. In the example of FIG. 10*a*, the output frequency of PLL 12 exactly matches the pixel rate. This is reflected in sample phases $P_{nc}$ remaining at a constant position within each pixel period, for all of pixel periods n through n+8 as shown. Upon finding an accurate sample phase $P_{nc}$ for a sample clock of this closely matching frequency, this sample phase will serve well for all pixels in the field or frame over time. Typically, PLL 12 is “line-locked”, in that its frequency is locked to the horizontal sync pulse. Thus the position of sample phase $P_{nc}$ for each pixel within a line will be the same for the same pixel position in all lines of the field or frame. The following description assumes such line-locking of PLL 12, although PLL 12 may be otherwise synchronized, as desired.

FIG. 10*b* illustrates an example of the sampling phases in which the sample clock frequency at the output of PLL 12 has a frequency that is slightly higher than the pixel rate. The effect shown in FIG. 10*b* is quite exaggerated, considering that only nine pixels are illustrated, but those skilled in the art having reference to this description will comprehend the concept as it can occur in video signal sampling. As shown in FIG. 10*b*, as successive pixels are received and sampled, the position of sample phase $P_{nc}$ within the pixel periods moves toward the leading edge. Based on the foregoing description, one can then expect that the count $C_b$ of beyond-threshold difference events for the sample phase $P_{nb}$ occurring before current sample phase $P_{nc}$ to increase as this shift takes place across a frame. In short, as one analyzes, from left-to-right within a frame, pixel periods that are sampled at too high a frequency, the position of the sample phase will tend to drift toward the leading edge of the pixel periods. Given enough pixels per line, the frequency error can cause the position of sample phase $P_{nc}$ to cross a pixel boundary (and then be nearer the trailing edge of the pixel period), in which case the counts $C_b$, $C_a$ will exhibit large values for at least some pixels in the line.

FIG. 10*c* illustrates a sequence of pixel periods n through n+8 in which sample phase $P_{nc}$ is at too low a frequency. As evident from this FIG. 10*c*, the location of sample phase $P_{nc}$ moves from the center of the pixel periods, as in pixel periods n and n+1, toward the trailing edge of pixel periods across the frame. In this event, one may expect the count $C_b$ of beyond-threshold difference events for the sample phase $P_{nb}$ occurring after current sample phase $P_{nc}$ to increase as this sample shift takes place across a frame. To summarize, as one analyzes, from left-to-right in a frame, a sequence of pixel periods that are sampled at too low a frequency, the position of the sample phase will tend to drift toward the trailing edge of the pixel periods, and will cross that boundary if the error is sufficiently large.

Figure 11:
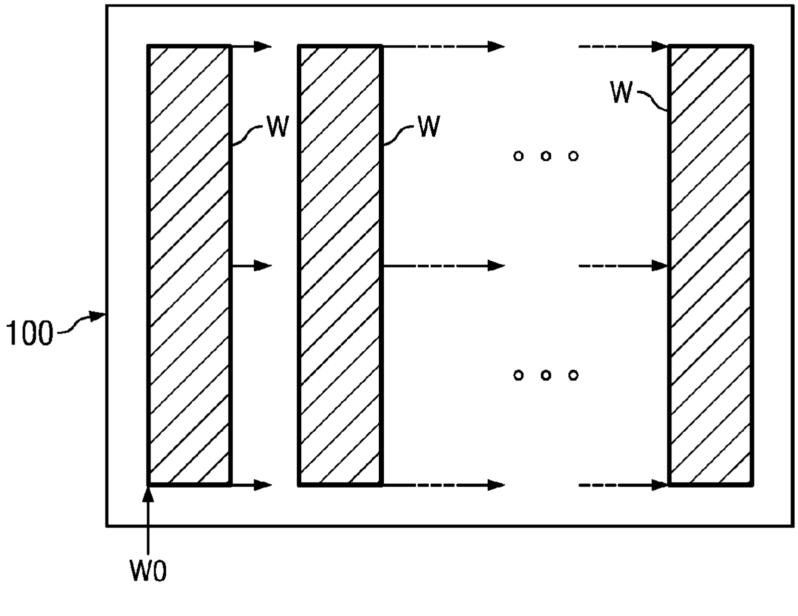
FIG. 11 illustrates the operation of an aspect of the preferred embodiments of the invention in which sample frequency error is measured.

As discussed above relative to FIG. 3, counters 26*b*, 26*a* each have an enable input at which they receive an enable signal on line ENA from graphics controller 14. According to the preferred embodiments of the invention, counters 26*b*, 26*a* can be selectively enabled by way of these enable inputs, so that only a window of pixels within each field or frame is measured and analyzed. This permits analysis of the event counts $C_b$, $C_a$ as a function of horizontal position within a field or frame, and thus a determination of whether the sample frequency is too high or too low, as will now be described in detail. FIG. 11 illustrates an example of the iterative positioning of such a window W across an image field or frame 100. As evident from FIG. 11, counters 26*b*, 26*a* will be enabled to advance their respective contents only during window W in any given field or frame, beginning from a beginning pixel W0 in each case. Analysis of changes in the counts $C_b$, $C_a$ as window W moves across the field or frame will indicate PLL frequency errors, as will now be described relative to FIG. 12.

Figure 12:
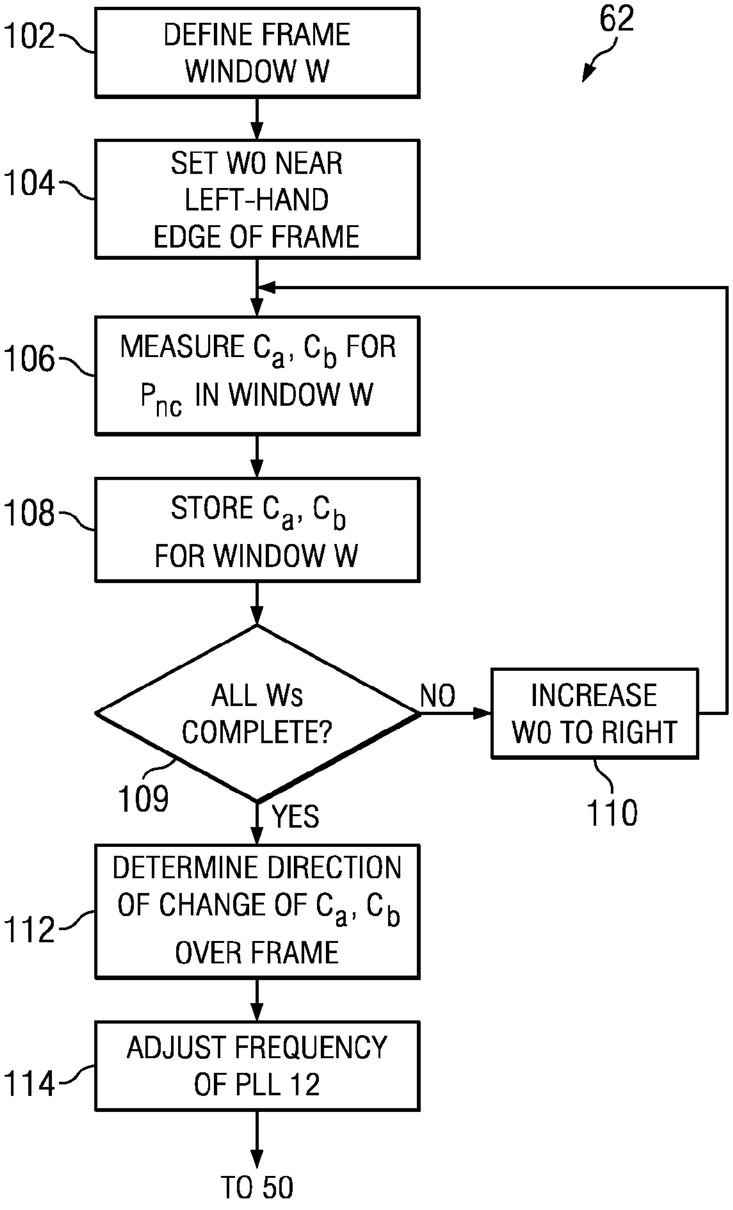
FIG. 12 is a flow diagram illustrating the operation of measuring sample frequency error in connection with the preferred embodiments of the invention.

FIG. 12 illustrates the operation of process 62 in measuring or determining adjustments to the frequency of PLL 12 based on the pixel rate, according to the preferred embodiment of the invention. In process 102, graphics controller 14 defines the width of sliding window W in the field or frame, and in process 104, graphics controller 14 sets initial pixel W0 for window W near the left-hand (temporally earlier) edge of the field or frame. Following process 104, graphics controller 14 comprehends the pixel periods of the field or frame within window W, and during which it will issue the enable signal on lines ENA to counters 26*b*, 26*a*. Process 106 is then executed, during which measurement process 50 is carried out over the field or frame for the current sample phase $P_{nc}$; however, because of the selective control of the enable signals on lines ENA, the count values $C_b$, $C_a$ are obtained only during window W, beginning with pixel location W0. These count values $C_b$, $C_a$ are stored in memory (e.g., memory of graphics controller 14) in process 108, in a manner that associates these values with the current position of window W. Decision 109 is then executed to determine whether all positions of W have been measured. If not (decision 109 is NO), counters 26*b*, 26*a* are cleared, pixel position W0 is incremented to the right (later in time), and process 106 is repeated. Upon completion of analysis for all pixel windows W over a corresponding number of fields or frames, in process 112 graphics controller 14 interrogates its memory to analyze the count values $C_b$, $C_a$ that were stored for all of the windows W in the execution of the operations of process 62.

As discussed above, if increases of the value of "before" event count $C_b$ occur before ("lead") increases in the value of "after" event count $C_a$ as the position of windows W advances across frame 100, then the sample phase $P_{nc}$ is moving toward the leading edge of the pixel period, indicating that the current frequency of PLL 12 is too high. Conversely, if increases of the value of "after" event count $C_a$ lead increases in the value of "before" event count $C_b$ as the position of windows W advances across frame 100, PLL 12 frequency is detected as being too low. The results of process 112 are then used in process 114, by way of which graphics controller 14 adjusts the frequency of PLL 12.

It is contemplated that the frequency error may be so large that, for a given window W size, the values of counts $C_b$, $C_a$ may oscillate within a window W because of multiple "wrap-arounds" of sample phase $P_{nc}$ crossing the pixel period boundaries. This oscillation may render it difficult to distinguish the sample frequency being too high from it being too low. In this event, the size of window W may be reduced to detect the direction of the frequency error. On the other hand, if window W is too narrow, the time required to scan a frame may become excessive. It is contemplated that one skilled in the art having reference to this specification will be readily able to derive an optimum window W size for a given system and environment.

Preferably, the adjustment of the frequency of PLL 12, as described above in connection with process 62, is performed iteratively with the alignment of current sample phase $P_{nc}$ as discussed above relative to FIG. 6. As such, after adjustment of the PLL frequency in process 114, control passes to process 50 to optimize the position of sample phase $P_{nc}$ within the pixel period. Adjustment of the frequency of PLL 12 may then be repeated, and the sample phase $P_{nc}$ again optimized, with these processes repeated until an optimal operating point is reached.

While PLL adjustment process 62 is described above as being carried out in the situation in which sample phase $P_{nc}$ could not be optimized, those skilled in the art having reference to this specification will also realize that adjustment of the PLL frequency can be done prior to any sample phase optimization (e.g., following process 44 in FIG. 6), rather than relying on a pixel rate estimate from process 44. In addition, PLL frequency adjustment process 62 may also be performed periodically to ensure excellent fidelity, or may be performed after a successful optimization of sample phase $P_{nc}$ to further improve the sampling characteristics.

According to this first preferred embodiment of the invention, as described above relative to FIG. 6, numerous important advantages are attained. One such advantage is the ability to optimize the sampling phase for the analog-to-digital conversion of the analog input video signal, without adversely affecting the quality of the video signal itself. This benefit is accomplished because the sampling performed by phase alignment circuitry 20 is in parallel with the main data path. In addition, the before and after sample phases $P_{nb}$, $P_{na}$, respectively, are not used in the display of the image. This permits the analysis to be carried out without changing sample phases to the point of display degradation, as is common in conventional approaches. Furthermore, each sample phase is sampled once per pixel period, thus maintaining relatively modest sample frequencies, and keeping the circuit cost and complexity low. And the actual sample values of the input signal need not be stored according to this preferred embodiment of the invention; rather, only the counts $C_b$, $C_a$ corresponding to the number of times a difference voltage exceeds the threshold in a field or frame, need be stored minimizing the hardware and computational resources required for phase alignment.

Figure 7:
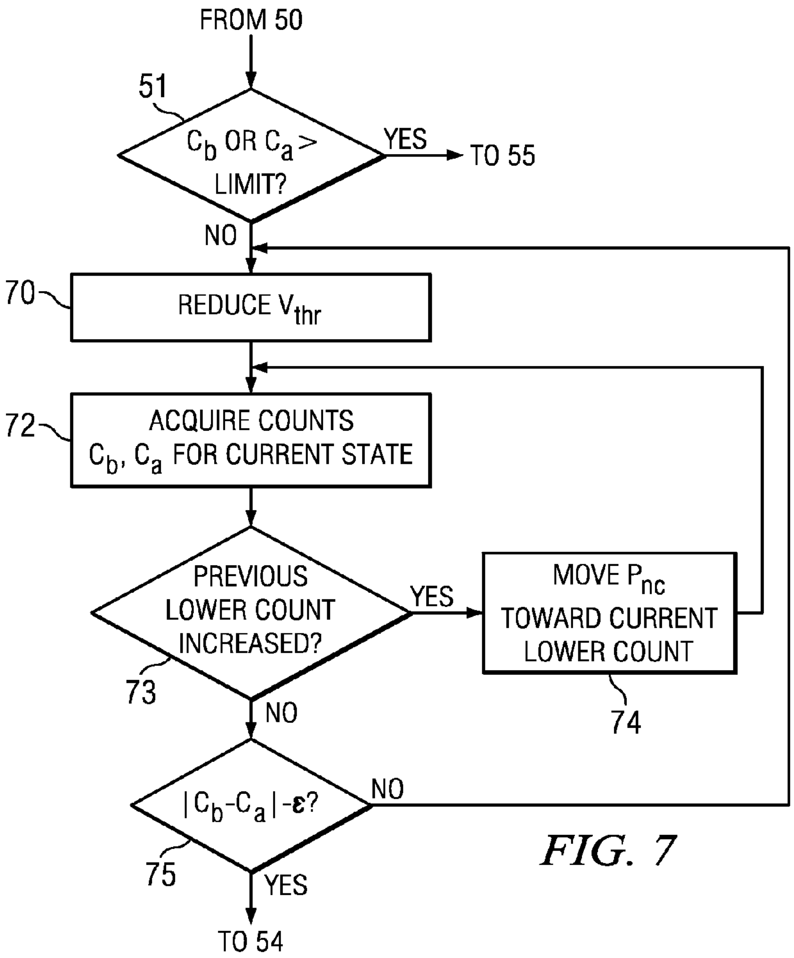
FIG. 7 is a flow diagram illustrating the operation of a method of optimizing the sample phase of an analog input video signal, as a variation to the first preferred embodiment of the invention.

Of course, many variations on this first preferred embodiment of the invention have also been discovered. FIG. 7 illustrates one such variation, in which further optimization of the position of sample phase $P_{nc}$ is obtained by iteratively reducing threshold voltage $V_{thr}$. As shown in FIG. 7, decision 51 is performed after measurement process 50, with new values of counts $C_b$, $C_a$ obtained from a recent field or frame. Counts $C_b$, $C_a$ are compared against the count limit value, in decision 51. If either (or both) of counts $C_b$, $C_a$ exceed this limit (decision 51 is YES), control passes to decision 55 as described above relative to FIG. 6. According to this variation, however, if neither of counts $C_b$, $C_a$ exceed the limit (decision 51 is NO), control passes to process 70, in which graphics controller 14 reduces threshold voltage $V_{thr}$ by applying a corresponding control signal (e.g., DAC control signals HI, LO) to comparators 24*b*, 24*a* (FIG. 3). In process 72, graphics controller 14 operates phase alignment circuitry 20 over a field or frame of the analog input video signal, to acquire new counts $C_b$, $C_a$ using the new, reduced, value of threshold voltage $V_{thr}$. Decision 73 determines whether the lower of these counts $C_b$, $C_a$ has increased because of the reduced threshold voltage $V_{thr}$ as compared with the value of the same count $C_b$, $C_a$ acquired with the previous value of threshold voltage $V_{thr}$. If so (decision 73 is YES), further optimization of the location of sample phase $P_{nc}$ can be attained. The position of sample phase $P_{nc}$ is adjusted in a direction toward the current lower one of the two counts $C_b$, $C_a$ in process 74, to move away from the ringing event that continues to result in the higher of the two counts. In other words, if "before" count $C_b$ is the higher of the two counts, and if count $C_a$ increased with the lower threshold voltage $V_{thr}$ to indicate that ringing is still present at this sample phase location, sample phase $P_{nc}$ is moved to later in the pixel period to avoid the higher ringing levels occurring prior to its current location. Conversely, if "after" count $C_a$ is the higher of the two, sample phase $P_{nc}$ is advanced earlier in the pixel period, in process 74. Process 72 is then repeated to obtain new counts $C_b$, $C_a$ for another field or frame, using the new position of sample phase $P_{nc}$.

If the lower count $C_b$, $C_a$ did not increase (decision 73 is NO), decision 75 is next performed to determine whether the counts $C_b$, $C_a$ are both low (below the limit of decision 51) and essentially equal to one another (differing by less than some value $\epsilon$). If the two counts $C_b$, $C_a$ differ from one another (decision 75 is NO), additional optimization remains available, by again reducing threshold voltage $V_{thr}$ in process 70, and repeating process 72 to obtain a new measurement of counts $C_b$, $C_a$. If the two counts $C_b$, $C_a$ are essentially the same as one another (decision 75 is YES), then counts $C_b$, $C_a$ are both at the same low value. This tends to indicate that current sample phase $P_{nc}$ is in an optimal location, because few ringing events are evident on either side of that phase location. Control returns to process 54 (FIG. 6), if desired, for periodic monitoring of this sample phase alignment.

Figure 8:
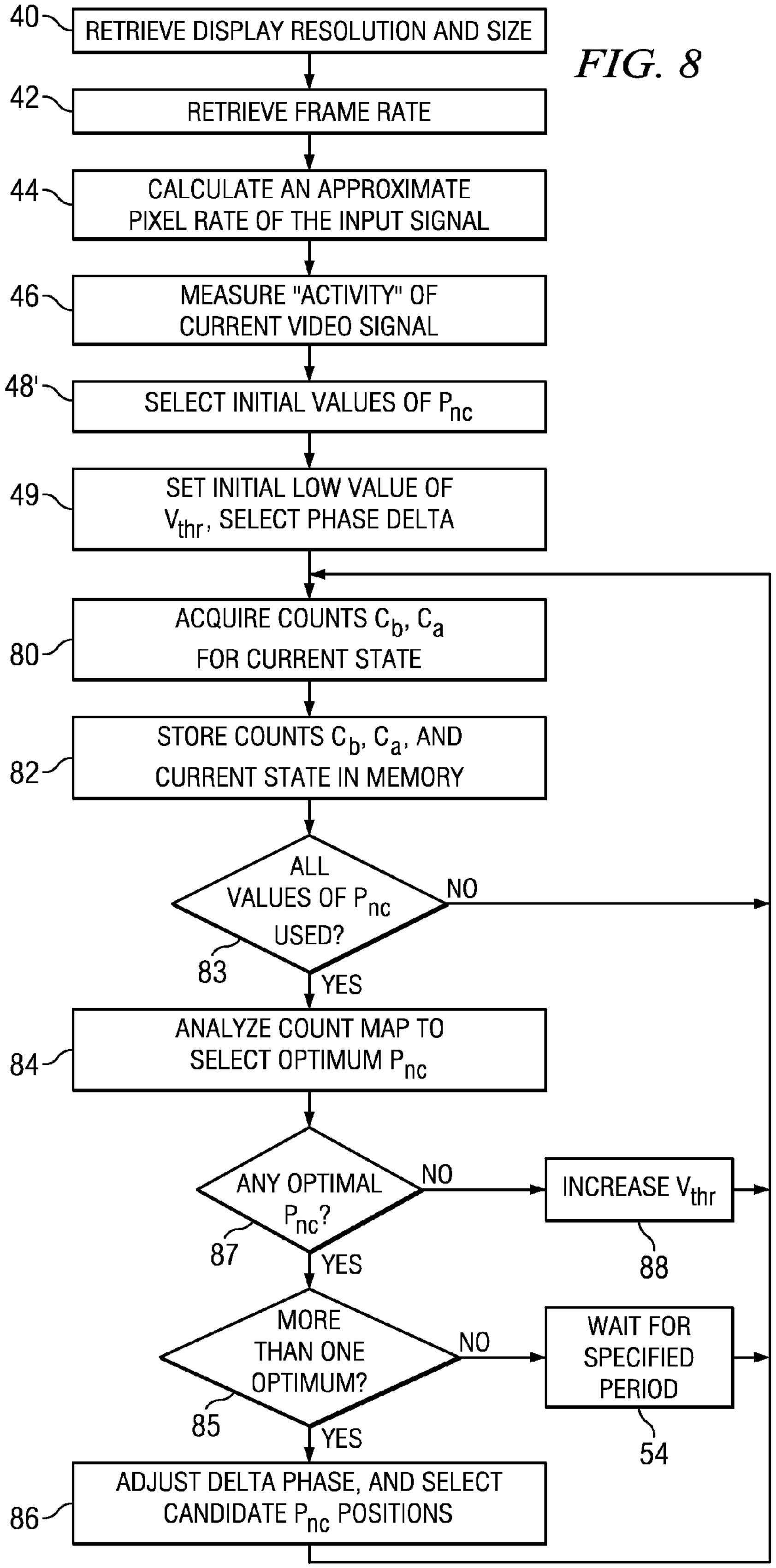
FIG. 8 is a flow diagram illustrating the operation of a method of optimizing the sample phase of an analog input video signal, according to a second preferred embodiment of the invention.

Referring now to FIG. 8, the operation of phase alignment circuitry 20 in system 2 according to a second preferred embodiment of the invention will now be described. As shown in FIG. 8, processes 40 through 46 are performed as described above, to determine an approximate pixel rate for the analog input video signal, and also to measure the pixel activity of the video signal, if desired, to ensure that the field or frame, or a portion of the field or frame, has sufficient pixel transition activity to permit optimization of the sample phase location within the pixel period. Adjustment of the output frequency of PLL 12 may also be performed as necessary, for example as described above relative to FIG. 12.

In process 48', multiple trial values of sample phase $P_{nc}$ are selected. In process 49, an initial value of threshold voltage $V_{thr}$ and an initial phase delta (difference between sample phase $P_{nc}$, on one hand, and each of before and after sample phases $P_{nb}$, $P_{na}$, on the other hand) are selected, preferably at a relatively low difference voltage. According to this embodiment of the invention, a map of the counts $C_b$, $C_a$ over a range of sample phase $P_{nc}$ positions is obtained. Analysis of this map of values can yield identification of the optimum sample phase location within the pixel period.

In process 80, counts $C_b$, $C_a$ are obtained over a field or frame of the analog input video signal, for a first selected sample phase $P_{nc}$ position. In process 82, graphics controller 14 stores these count values in memory, associated with the position of sample phase $P_{nc}$ at which they were obtained. Decision 83 determines whether all of the trial sample phase $P_{nc}$ positions selected in process 48' have been used; if not (decision 83 is NO), counters **26*b*, 26*a* are cleared, and measurement process 80** is repeated for another sample phase $P_{nc}$ position.

Upon the acquiring and storing of counts $C_b$, $C_a$ for all selected positions of sample phase $P_{nc}$ (decision 83 is YES), graphics controller 14 performs process 84 to analyze these count values. This analysis process 84 identifies one or more positions of sample phase $P_{nc}$ as having low values of both its "before" and "after" counts $C_b$, $C_a$, respectively, which indicates an accurate and stable location at which to acquire samples. Decision 87 determines whether any such optimal positions were detected in process 84, by comparing the counts $C_b$, $C_a$ for each sample phase position $P_{nc}$ against a value limit. If none were detected (decision 87 is NO), threshold voltage $V_{thr}$ is increased in process 88, and process 80 is repeated over the entire set of sample phase $P_{nc}$ positions.

If at least one optimal location is identified (decision 87 is YES), decision 85 is then performed to determine whether more than one such point was identified. If so (decision 85 is YES), then additional analysis is required to select from among such positions, and also to ensure that the eventual sample phase $P_{nc}$ position is not set to a local extrema. Process 86 adjusts the delta phase (differences among the sample phases $P_{nb}$, $P_{nc}$, $P_{na}$), and selects the candidate sample phase PnC positions identified in process 84 and decision 87 for analysis in process 80. Processes 80, 82, 83 are then repeated to obtain counts $C_b$, $C_a$ over a field or frame for each of these candidate $P_{nc}$ positions. On the other hand, if only one optimum sample phase $P_{nc}$ position is identified by process 84 and decision 87 (decision 85 is NO), then this identified position is used as the position of sample phase $P_{nc}$ within the pixel period. Phase alignment circuitry 20 then enters process 54, if desired, to await the next periodic monitoring event.

This second preferred embodiment of the invention attains similar advantages and benefits as discussed above in connection with the first preferred embodiment of the invention. These benefits and advantages include the optimization of the sampling phase for analog-to-digital conversion of the analog input video signal, without degrading the resulting displayed image, again because the sampling by the phase alignment circuitry is acquired in parallel with the main data path. The sample phase used for actual video signal digitization, according to each of these embodiments of the invention, need not be moved to a poorer location in order for optimization to be performed; rather, the active sample phase is moved only to a better location of the pixel period. The user of the display system is thus unaware of any adjustment or alignment of the sample phase, unlike conventional phase alignment techniques. And because each sample phase is sampled once per pixel period, this invention can be operated at relatively modest sample frequencies, which keeps circuit cost and complexity low. The memory requirements for implementing this invention are also quite modest, as evident from the foregoing description.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of determining a sample phase location within periods of an input signal, comprising the steps of:

sampling the input signal at a current sample clock phase within a period of the input signal to obtain a current sample value;

sampling the input signal at a first sample clock phase prior in time to the current sample clock phase within the period of the input signal to obtain a first sample value;

sampling the input signal at a second sample clock phase later in time to the current sample clock phase within the period of the input signal to obtain a second sample value;

determining first and second difference voltages corresponding to the difference between the first sample value and the current sample value, and to the difference between the second sample value and the current sample value, respectively;

counting a first number corresponding to the number of times the first difference voltage exceeds a threshold voltage over a selected number of repetitions of the sampling and determining steps;

counting a second number corresponding to the number of times the second difference voltage exceeds the threshold voltage over the selected number of repetitions of the sampling and determining steps; and adjusting the position of the current sample clock phase within the period of the input signal responsive to the first and second numbers.

2. The method of claim 1, further comprising:

generating a plurality of clock phases at a frequency corresponding to the frequency of the input signal;

selecting the current clock phase from the plurality of clock phases; and selecting the first and second sample clock phases from the plurality of clock phases;

wherein the adjusting step comprises:

selecting another one of the plurality of clock phases as the current sample clock phase.

3. The method of claim 2, wherein the adjusting step comprises:

selecting an earlier one of the plurality of clock phases responsive to the second number exceeding a limit value and the first number not exceeding the limit value; and selecting a later one of the plurality of clock phases responsive to the first number exceeding a limit value and the second number not exceeding the limit value.

4. The method of claim 1, wherein the input signal corresponds to an analog input video signal.

5. The method of claim 4, further comprising:

converting the current sample value to a digital value.

6. The method of claim 4, further comprising:

estimating a sample frequency corresponding to a pixel rate of the analog input video signal.

7. The method of claim 6, wherein the adjusting step comprises:

selecting an earlier one of the plurality of clock phases responsive to the second number exceeding a limit value and the first number not exceeding the limit value; and selecting a later one of the plurality of clock phases responsive to the first number exceeding a limit value and the second number not exceeding the limit value;

and further comprising:

responsive to both the first and second numbers exceeding the limit value, increasing the threshold voltage; and then repeating the sampling, determining, counting, and adjusting steps.

8. The method of claim 6, wherein the adjusting step comprises:

selecting an earlier one of the plurality of clock phases responsive to the second number exceeding a limit value and the first number not exceeding the limit value; and selecting a later one of the plurality of clock phases responsive to the first number exceeding a limit value and the second number not exceeding the limit value;

and further comprising:

responsive to both the first and second numbers exceeding the limit value, increasing the time between the first sample phase and the current sample phase, and between the second sample phase and the current sample phase; and then repeating the sampling, determining, counting, and adjusting steps.

9. The method of claim 6, wherein the sampling steps are repeated for a number of pixel periods corresponding to a video frame;

and further comprising:

defining a frame window within a selected horizontal portion of the video frame;

performing the counting steps for a selected number of repetitions of the sampling and determining steps corresponding to the frame window;

storing the first and second numbers in memory;

advancing the frame window to another selected horizontal portion of the video frame in a first direction;

repeating the performing and storing steps;

then adjusting the sample frequency responsive to either the first or second numbers increasing in value for advanced positions of the frame window in the first direction.

10. The method of claim 6, further comprising:

responsive to neither of the first and second numbers exceeding the limit value, decreasing the threshold voltage; and then repeating the sampling, determining, counting, and adjusting steps.

11. The method of claim 1, further comprising:

after the counting steps, storing the first and second numbers in memory in association with the current sample clock phase;

advancing the current sample clock phase and the first and second sample clock phases, to a different position in the period of the input signal;

then repeating the sampling, determining, counting, and storing steps at the different position;

repeating the advancing and repeating steps for a plurality of positions of the current sample clock phase; and analyzing the first and second numbers for each of the plurality of positions of the current sample clock phase to identify a position at which the first and second numbers are below a limit;

wherein the adjusting step adjusts the current sample clock phase to the identified position from the analyzing step.

12. The method of claim 11, further comprising:

responsive to the analyzing step not identifying a position at which the first and second numbers are below the limit, increasing the threshold voltage, and then repeating the sampling, determining, counting, and storing steps over each of the plurality of positions of the current sample clock phase.

13. The method of claim 11, further comprising:

responsive to the analyzing step identifying a plurality of positions at which the first and second numbers are below the limit, increasing the time between the current sample clock phase and the first sample clock phase, and between the current sample clock phase and the second sample clock phase, and then repeating the sampling, determining, counting, and storing steps over each of the plurality of positions of the current sample clock phase.

14. The method of claim 11, wherein the input signal corresponds to an analog input video signal;

and further comprising:

converting the current sample value to a digital value.

15. The method of claim 14, further comprising:

responsive to a difference between the current sample value and a previous sample value exceeding a threshold value, advancing an activity counter; and responsive to a count value stored in the activity counter exceeding a selected limit value, identifying at least a portion of a frame of the analog input video signal over which to perform the counting steps.

16. Analog-to-digital conversion circuitry having phase alignment capability, comprising:

a phase-locked loop for generating a plurality of clock phases at a frequency;

an analog-to-digital converter, for sampling an analog input signal at a current sample clock phase selected from one of the plurality of clock phases, and for converting the sampled analog input signal to a digital value; and phase alignment circuitry, comprising:

a current sample circuit, for sampling the analog input signal at the current sample clock phase, to produce a current sample voltage;

a first sample circuit, for sampling the analog input signal at a first sample clock phase that is selected from the plurality of clock phases and that occurs earlier in time than the current sample clock phase, to produce a first sample voltage;

a second sample circuit, for sampling the analog input signal at a second sample clock phase that is selected from the plurality of clock phases and that occurs later in time than the current sample clock phase, to produce a second sample voltage;

a first comparator for comparing a first difference voltage corresponding to a difference between the first sample voltage and the current sample voltage to a threshold voltage;

a second comparator for comparing a second difference voltage corresponding to a difference between the second sample voltage and the current sample voltage to the threshold voltage;

a first counter, coupled to the first comparator, for maintaining a count corresponding to a number of times that the first comparator detects the first difference voltage exceeding the threshold voltage; and a second counter, coupled to the second comparator, for maintaining a count corresponding to a number of times that the second comparator detects the second difference voltage exceeding the threshold voltage.

17. The circuitry of claim 16, wherein the first difference voltage corresponds to the absolute value of the difference between the first sample voltage and the current sample voltage, and wherein the second difference voltage corresponds to the absolute value of the difference between the second sample voltage and the current sample voltage.

18. A video display system, comprising:

a digital graphics display;

an analog input for receiving an analog input video signal;

a phase-locked loop for generating a plurality of clock phases at a sample frequency;

an analog-to-digital converter, for sampling an analog input signal at a current sample clock phase selected from one of the plurality of clock phases, and for converting the sampled analog input signal to a digital value;

a graphics controller, for processing the digital values from the analog-to-digital converter;

driver circuitry, coupled to the graphics controller and to the digital graphics display, for driving the digital graphics display responsive to the processed digital values from the graphics controller; and phase alignment circuitry, comprising:

a current sample circuit, for sampling the analog input signal at the current sample clock phase, to produce a current sample voltage;

a first sample circuit, for sampling the analog input signal at a first sample clock phase that is selected from the plurality of clock phases and that occurs earlier in time than the current sample clock phase, to produce a first sample voltage;

a second sample circuit, for sampling the analog input signal at a second sample clock phase that is selected from the plurality of clock phases and that occurs later in time than the current sample clock phase, to produce a second sample voltage;

a first comparator for comparing a first difference voltage corresponding to a difference between the first sample voltage and the current sample voltage to a threshold voltage;

a second comparator for comparing a second difference voltage corresponding to a difference between the second sample voltage and the current sample voltage to the threshold voltage;

a first counter, coupled to the first comparator, for maintaining a first count corresponding to a number of times that the first comparator detects the first difference voltage exceeding the threshold voltage; and a second counter, coupled to the second comparator, for maintaining a second count corresponding to a number of times that the second comparator detects the second difference voltage exceeding the threshold voltage; and control circuitry for adjusting the selection of the one of the plurality of clock phases as the current sample clock phase responsive to the first and second counts.

19. The system of claim 18, wherein the control circuitry is comprised of a function executed by the graphics controller.

20. The system of claim 18, wherein the control circuitry is arranged to select an earlier one of the plurality of clock phases as the current sample clock phase responsive to the second number exceeding a limit value and the first number not exceeding the limit value over at least a portion of a frame of the input video signal;

and wherein the control circuitry is arranged to select a later one of the plurality of clock phases as the current sample clock phase responsive to the first number exceeding a limit value and the second number not exceeding the limit value over at least a portion of a frame of the input video signal.

21. The system of claim 20, wherein the control circuitry is also arranged to increase the threshold voltage responsive to both the first and second numbers exceeding the limit value over at least a portion of a frame of the input video signal.

22. The system of claim 20, wherein the control circuitry is also arranged to increase the time between the first sample clock phase and the current sample clock phase, and to increase the time between the second sample clock phase and the current sample clock phase, responsive to neither of the first and second numbers exceeding the limit value over at least a portion of a frame of the input video signal.

23. The system of claim 20, wherein each of the first and second counters advances its count when enabled by an enable signal;

wherein the control circuitry is also for issuing the enable signal to the first and second counters at times corresponding to a selected frame window within a selected horizontal portion of a video frame communicated by the analog input video signal;

wherein the control circuitry comprises a memory;

wherein the control circuitry is also arranged to store values of the first and second numbers in the memory in association with a selected frame window position;

and wherein the control circuitry is also arranged to adjusting the sample frequency responsive to either the first or second numbers increasing in value for frame window positions advancing in a selected direction across the video frame.

24. The system of claim 20, wherein the control circuitry comprises a memory;

wherein the control circuitry is arranged to store, in memory, the first and second numbers in association with each of a plurality of current sample clock phases;

and wherein the control circuitry is also arranged to analyze the stored first and second numbers to identify at least one of the plurality of current sample clock phases at which the first and second numbers are below a limit.

25. The system of claim 20, wherein the phase alignment circuitry further comprises:

activity measurement circuitry, for generating an indication of pixel activity of a sequence of digital values corresponding to the analog input signal;

wherein each of the first and second counters advances its count when enabled by an enable signal;

wherein the control circuitry is also for issuing the enable signal to the first and second counters at times corresponding to portions of a video frame communicated by the analog input video signal at which a selected level of pixel activity is indicated by the activity measurement circuitry.

* * * * *